United States Patent
Guo et al.

(10) Patent No.: US 11,222,785 B2
(45) Date of Patent: Jan. 11, 2022

(54) METHOD FOR DEPOSITING A METAL LAYER ON A WAFER

(71) Applicant: United Semiconductor (Xiamen) Co., Ltd., Fujian (CN)

(72) Inventors: Xijun Guo, Fujian (CN); Jianhua Chen, Fujian (CN); Haipeng Zhu, Fujian (CN); Xianlei Zhang, Fujian (CN); Min-Hsien Chen, Taichung (TW); Ching-Ning Yang, Kaohsiung (TW); Wen Yi Tan, Fujian (CN)

(73) Assignee: United Semiconductor (Xiamen) Co., Ltd., Xiamen (CN)

( * ) Notice: Subject to any disclaimer, the term of this patent is extended or adjusted under 35 U.S.C. 154(b) by 127 days.

(21) Appl. No.: 16/543,628

(22) Filed: Aug. 19, 2019

(65) Prior Publication Data
US 2021/0013041 A1 Jan. 14, 2021

(30) Foreign Application Priority Data
Jul. 11, 2019 (CN) .......................... 201910623790.1

(51) Int. Cl.
*C23C 14/35* (2006.01)
*H01L 21/285* (2006.01)
*C23C 14/14* (2006.01)

(52) U.S. Cl.
CPC ........ *H01L 21/28506* (2013.01); *C23C 14/14* (2013.01); *C23C 14/35* (2013.01)

(58) Field of Classification Search
CPC ....... C23C 14/14; C23C 14/35; H01L 21/285; H01L 21/28406
See application file for complete search history.

(56) References Cited

U.S. PATENT DOCUMENTS

| | | | | |
|---|---|---|---|---|
| 4,414,087 A | * | 11/1983 | Meckel | C23C 14/3407 204/192.15 |
| 5,707,498 A | * | 1/1998 | Ngan | C23C 14/35 204/192.12 |
| 6,156,164 A | * | 12/2000 | Smolanoff | C23C 14/35 204/192.12 |
| 6,176,978 B1 | * | 1/2001 | Ngan | C23C 14/564 204/192.12 |
| 6,699,372 B2 | * | 3/2004 | Bhowmik | C23C 14/32 204/192.12 |
| 2012/0199469 A1 | * | 8/2012 | Rasheed | C23C 14/3414 204/192.1 |

(Continued)

*Primary Examiner* — Rodney G Mcdonald
(74) *Attorney, Agent, or Firm* — Winston Hsu

(57) ABSTRACT

A method for depositing a metal layer on a wafer is disclosed. A PVD chamber is provide having therein a wafer chuck for holding a wafer to be processed, a target situated above the wafer chuck, a magnet positioned on a backside of the target, and a DC power supply for supplying a DC voltage to the target. The target is a metal or a metal alloy having ferromagnetism property. A paste process is performed to the PVD chamber. The paste process includes sequential steps of: admitting a working gas into the PVD chamber; and igniting the working gas in cascade stages. The wafer is then loaded into the PVD chamber and positioned onto the wafer chuck. A deposition process is then performed to deposit a metal layer sputtered from the target onto the wafer.

18 Claims, 6 Drawing Sheets

| Parameter \ Stage | S1 | S2 | S3 | S4 | S5 | S6 | S7 |
|---|---|---|---|---|---|---|---|
| Time(s) | 60 | 60 | 10 | 10 | 10 | 10 | 60 |
| DC power (Kwh) | 0 | 100 | 200 | 300 | 500 | 700 | 1000 |
| Flowrate (sccm) | 15 | 15 | 15 | 15 | 15 | 15 | 15 |

(56) References Cited

U.S. PATENT DOCUMENTS

2013/0048489 A1* 2/2013 Yamaguchi ............. C23C 14/35
                                                    204/192.15
2013/0087447 A1* 4/2013 Bodke ................... C23C 14/046
                                                    204/192.15

* cited by examiner

| Parameter \ Stage | S1 | S2 | S3 | S4 | S5 | S6 | S7 |
|---|---|---|---|---|---|---|---|
| Time(s) | 60 | 60 | 10 | 10 | 10 | 10 | 60 |
| DC power (Kwh) | 0 | 100 | 200 | 300 | 500 | 700 | 1000 |
| Flowrate (sccm) | 15 | 15 | 15 | 15 | 15 | 15 | 15 |

FIG. 3

| Parameter \ Stage | S1 | S2 | S3 | S4 | S5 | S6 | S7 | S8 | S9 | S10 |
|---|---|---|---|---|---|---|---|---|---|---|
| Time(s) | 60 | 30 | 30 | 30 | 10 | 10 | 10 | 10 | 10 | 60 |
| DC power (Kwh) | 0 | 100 | 110 | 120 | 150 | 200 | 300 | 500 | 700 | 1000 |
| Flowrate (sccm) | 15 | 15 | 15 | 15 | 15 | 15 | 15 | 15 | 15 | 15 |

FIG. 4

METHOD FOR DEPOSITING A METAL LAYER ON A WAFER

BACKGROUND OF THE INVENTION

1. Field of the Invention

The present invention relates to the field of semiconductor process technology, and more particularly to a method of depositing a metal layer on a wafer.

2. Description of the Prior Art

Magnetron sputtering is a principal method of depositing metal onto a semiconductor wafer to form electrical connections and other structures in the integrated circuit. A target with metal composition is used to be deposited, and ions in plasma are attracted to the target at sufficient energy that target atoms are dislodged from the target, that is, sputtered. The sputtered atoms travel generally ballistically toward the wafer being sputter coated, and the metal atoms are deposited on the wafer in metallic form. Alternatively, the metal atoms react with another gas in the plasma, for example, nitrogen, to reactively deposit a metal compound on the wafer.

DC magnetron sputtering is the most usually practiced commercial form of sputtering. The metallic target is biased to a negative DC bias to attract positive ions of the argon working gas toward the target to sputter the metal atoms. Usually, the sides of the sputter reactor are covered with a shield to protect the chamber walls from sputter deposition. The shield is typically electrically grounded and thus provides an anode in opposition to the target cathode to capacitively couple the DC target power into the chamber and its plasma.

A magnetron having at least a pair of opposed magnetic poles is disposed in back of the target to generate a magnetic field close to and parallel to the front face of the target. The magnetic field traps electrons, and, for charge neutrality in the plasma, additional argon ions are attracted into the region adjacent to the magnetron to form there high-density plasma. Thereby, the sputtering rate is increased.

Nickel is a ferromagnetic material. As a result, the magnetic field produced by the magnetron is at least partially shunted through the nickel target and does not contribute to the formation of the high-density plasma region. Some diminution of the plasma density because of the reduced magnetic flux beneath the magnetron is not a major problem for nickel sputtering. However, ignition of the plasma with a ferromagnetic target does present a problem.

SUMMARY OF THE INVENTION

The present disclosure provides an improved semiconductor process, which can effectively solve the problem of igniting the plasma when a ferromagnetic target is used.

According to an embodiment of the invention, first, a physical vapor deposition (PVD) chamber is provided. The PVD chamber comprises a wafer chuck for holding a wafer to be processed, a target situated above the wafer chuck, a magnet positioned on a backside of the target, and a DC power supply for supplying a DC voltage to the target. The target is a metal or a metal alloy having ferromagnetism property. Subsequently, the PVD chamber is subjected to a paste process. The paste process includes sequential steps of admitting a working gas into the PVD chamber; and igniting the working gas in cascade stages. Subsequently, the wafer is loaded into the PVD chamber and is positioned onto the wafer chuck. A deposition process is then performed to deposit a metal layer sputtered from the target onto the wafer.

According to an embodiment of the invention, the step of igniting the working gas in cascade stages includes applying a first DC power for a first time period and sequentially applying a second DC power for a second time period. The second DC power is greater than the first DC power. The first DC power and the second DC power are less than 500 W.

According to an embodiment of the invention, the target comprises nickel (Ni), cobalt (Co), or alloys thereof.

According to an embodiment of the invention, the target comprises nickel platinum (NiPt) alloy.

According to an embodiment of the invention, the target comprises nickel platinum (NiPt) alloy with Pt in an amount of 0-10 wt. %.

According to an embodiment of the invention, the working gas comprises argon.

According to an embodiment of the invention, the admitting working gas into the PVD chamber is at a flowrate of about 15-60 sccm for less than 60 seconds.

According to an embodiment of the invention, the first DC power is about 100 W and the first time period is less than or equal to 60 seconds.

According to an embodiment of the invention, the second DC power is 200 W and the second time period is less than or equal to 10 seconds.

According to an embodiment of the invention, the step of igniting the working gas in cascade stages further comprises: applying a third DC power for a third time period, wherein the third DC power is greater than the second DC power.

According to an embodiment of the invention, the third DC power is 300 W and the third time period is less than or equal to 10 seconds.

According to an embodiment of the invention, the step of igniting the working gas in cascade stages further comprises: applying a fourth DC power for a fourth time period, wherein the fourth DC power is greater than the third DC power.

According to an embodiment of the invention, the fourth DC power is 500 W and the fourth time period is less than or equal to 10 seconds.

According to an embodiment of the invention, the step of igniting the working gas in cascade stages further comprises: applying a fifth DC power for a fifth time period, wherein the fifth DC power is greater than the fourth DC power.

According to an embodiment of the invention, the fifth DC power is 700 W and the fifth time period is less than or equal to 10 seconds.

According to an embodiment of the invention, the step of igniting the working gas in cascade stages further comprises: applying a sixth DC power for a sixth time period, wherein the sixth DC power is greater than the fifth DC power.

According to an embodiment of the invention, the sixth DC power is 1000 W and the sixth time period is less than or equal to 60 seconds.

According to an embodiment of the invention, when performing the paste process to the PVD chamber, the DC voltage does not exceed 1000V.

According to an embodiment of the invention, the target reaches its Curie temperature when performing the paste process to the PVD chamber.

According to an embodiment of the invention, the deposition process comprises the steps of: admitting the working gas into the PVD chamber; maintaining chamber pressure at less than 5 mTorr; and igniting the working gas by applying a DC power of about 2000 W for a maximum time period of about three seconds.

According to an embodiment of the invention, the first DC power is about 100 W, the first time period is about 30 seconds, the second DC power is about 110 W, and the second time period is about 30 seconds.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 is a table showing parameters of the paste process according to an embodiment of the invention.

FIG. 4 is a table showing the parameters of the paste process according to another embodiment of the present invention.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in detail to enable those skilled in the art to practice the invention.

Other embodiments may be utilized and structural, logical, and electrical changes may be made without departing from the scope of the present invention. Therefore, the following detailed description is not to be considered as limitation, but the embodiments included herein are defined by the scope of the accompanying claims.

Figure 1:
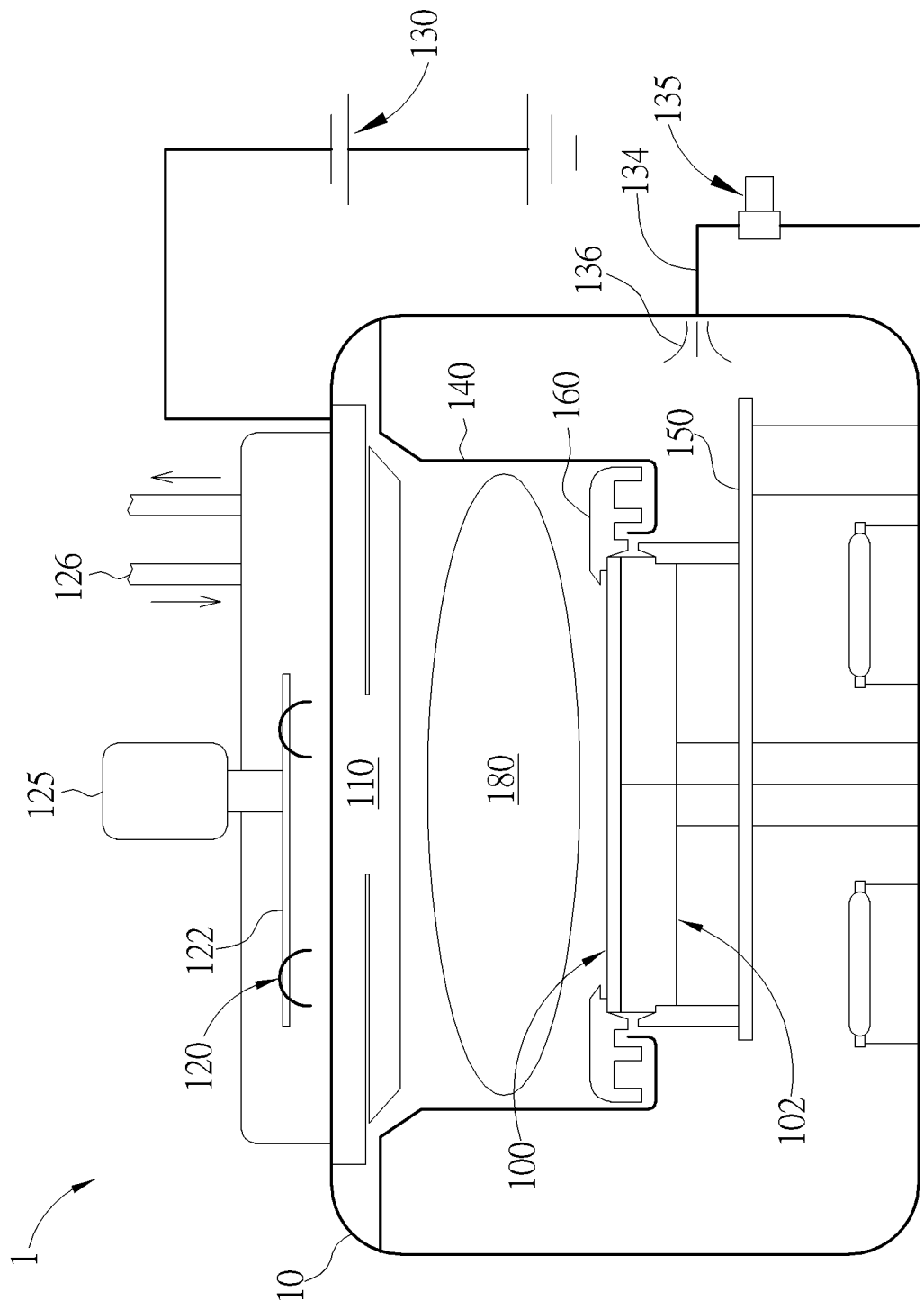
FIG. 1 is a schematic diagram of a physical vapor deposition (PVD) apparatus according to an embodiment of the invention.

Please refer to FIG. 1, which is a schematic diagram of a physical vapor deposition (PVD) apparatus according to an embodiment of the invention. As shown in FIG. 1, the PVD apparatus 1 may include a PVD chamber 10 having a wafer chuck 102 for holding a wafer 100 to be processed, a target 110 situated above the wafer chuck 102, a magnet 120 positioned on the backside of the target 110, and a DC power supply 130 for supplying a DC voltage to the target 110.

According to an embodiment of the invention, for example, the target 110 is a metal or metal alloy having ferromagnetism property. According to an embodiment of the invention, for example, the target 110 may comprise nickel (Ni), cobalt (Co) or alloys thereof. According to an embodiment of the invention, for example, the target 110 comprises a nickel platinum (NiPt) alloy. According to an embodiment of the invention, for example, the target 110 comprises a nickel platinum alloy having a platinum content of between 0 and 10 wt. %.

According to an embodiment of the invention, the magnet 120 can be fixed on a fixing member 122, and the fixing member 122 can be rotated horizontally by a motor 125. Further, according to an embodiment of the present invention, the PVD apparatus 1 may further include a water cooling device 126 for cooling the target 110 and the magnet 120.

According to an embodiment of the present invention, a shielding wall 140 may be disposed within the PVD chamber 10. When the wafer chuck 102 is raised to a predetermined position by the lifting mechanism 150, the retaining ring 160 is fixed to the edge of the wafer 100 to be processed. A plasma generating space is formed between the target 110, the shielding wall 140, and the surface of the wafer 100 to be processed, and plasma 180 can be generated in the plasma generating space.

Additionally, the PVD apparatus 1 may further include a gas supply line 134 that controls the desired working gas to enter the PVD chamber 10 via a control valve 135. Although not shown in the drawings, those skilled in the art will appreciate that the PVD apparatus 1 may further include other components or parts, such as a cryogenic pump, a collimator, or the like. Of course, the present disclosure is also applicable to other types of DC magnetron sputtering tools.

Figure 2:
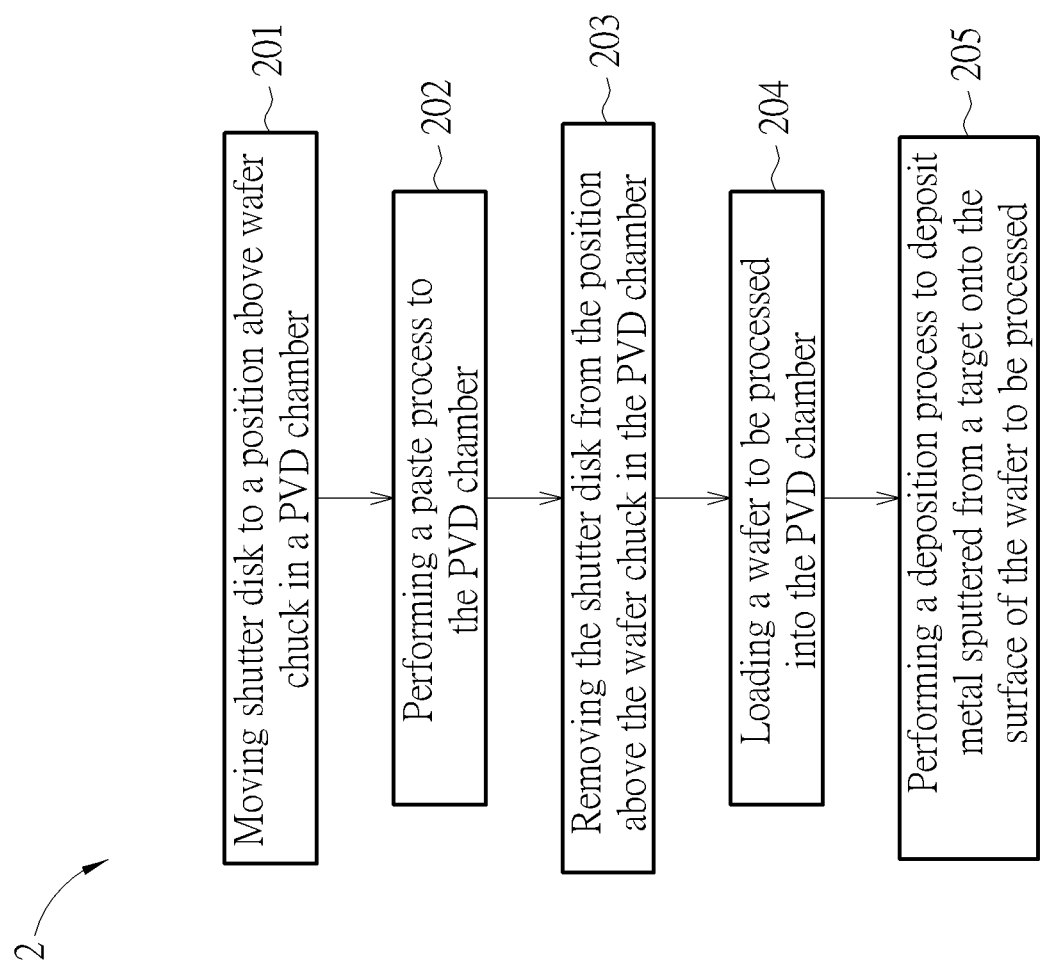
FIG. 2 is a flow chart of a method according to an embodiment of the invention.

Please refer to FIG. 2, which is a flowchart of a method according to an embodiment of the invention. As shown in FIG. 2, first, Step 201 of the method 2 is performed to move a shutter disk (not shown) to a position above the wafer chuck 102 in the PVD chamber 10 depicted in FIG. 1. Subsequently, Step 202 is performed to subject the PVD chamber 10 to a paste process including: admitting a working gas 136 into the PVD chamber 10, and then igniting the working gas 136 in cascade stages.

According to an embodiment of the invention, the aforesaid working gas comprises argon (Ar). According to an embodiment of the present invention, for example, the working gas 136 is introduced into the PVD chamber 10 at a flow rate of 15-60 sccm for less than 60 seconds.

According to an embodiment of the invention, the step of igniting the working gas 136 in cascade stages comprises applying a first direct current (DC) power for a first time period and applying a second DC power for a second time period, wherein the second DC power is greater than the first DC power, and wherein the first DC power and the second DC power are both less than 500 W.

According to an embodiment of the invention, for example, the first DC power may be about 100 W and the first time period may be less than or equal to 60 seconds. According to an embodiment of the invention, for example, the second DC power may be about 200 W and the second time period may be less than or equal to 10 seconds.

According to an embodiment of the invention, the step of igniting the working gas 136 in cascade stages further comprises applying a third DC power for a third time period, wherein the third DC power is greater than the second DC power.

According to an embodiment of the invention, the step of igniting the working gas 136 in cascade stages further comprises applying a fourth DC power for a fourth time period, wherein the fourth DC power is greater than the third DC power.

According to an embodiment of the invention, the step of igniting the working gas 136 in cascade stages further comprises applying a fifth DC power for a fifth time period, wherein the fifth DC power is greater than the fourth DC power.

According to an embodiment of the invention, the step of igniting the working gas 136 in cascade stages further comprises applying a sixth DC power for a sixth time period, wherein the sixth DC power is greater than the fifth DC power.

According to an embodiment of the invention, when the PVD chamber is subjected to the paste process, the DC voltage does not exceed 1000V, so that shutdown or abnormal signal of the DC power supply 130 can be avoided. According to an embodiment of the present invention, wherein the temperature of the target 110 reaches its Curie temperature when performing the paste process to the PVD chamber, such that the ferromagnetism of the target 110 is suppressed and the ignition of the plasma becomes easier.

Please refer to FIG. 3, which shows parameters of the paste process according to an embodiment of the invention. As shown in FIG. 3 and FIG. 1, according to an embodiment of the invention, the paste process includes: introducing a working gas 136 into the PVD chamber 10, and then igniting the working gas 136 in the PVD chamber 10 in cascade stages. In FIG. 3, the working gas 136 is first introduced into the PVD chamber 10 at a flow rate of 15 sccm for about 60 seconds (S1). Next, the working gas 136 is ignited in cascade stages, for example, including six stages S2 to S7. In S2 stage, the DC power is supplied for 100 W for about 60 seconds. In S3 stage, the DC power of 200 W is supplied for about 10 seconds. In S4 stage, the DC power of 300 W is supplied for about 10 seconds. In S5 stage, the DC power of 500 W is supplied for about 10 seconds. In S6 stage, the DC power of 700 W is supplied for about 10 seconds. In S7 stage, DC power of 1000 W is supplied for about 60 seconds.

After the above-described paste process is completed, Step 203 is performed to move the shutter disk away from the wafer chuck 102 in the PVD chamber 10. After the above-described warm-up operation, Step 204 is then performed to load the wafer 100 to be processed into the PVD chamber 10. The wafer 100 to be processed is positioned on the wafer chuck 102. Subsequently, Step 205 is performed and a deposition process is performed to deposit metal sputtered from the target 110 onto the surface of the wafer 100 to be processed.

According to an embodiment of the invention, the aforesaid deposition process may comprise the steps of: admitting the working gas 136 into the PVD chamber 10; maintaining a chamber pressure below 5 mTorr; and igniting the working gas 136 by applying a DC power of about 2000 W for a maximum time period of about 3 seconds.

According to another embodiment of the present invention, the shutter disk described in FIG. 2 may be replaced by a test wafer. The difference is that the test wafer needs to be externally loaded into the PVD chamber 10, so Step 203 is performed to remove test wafer from the PVD chamber 10, and the shutter disk is originally located inside the PVD chamber 10 without external loading.

Figure 5:
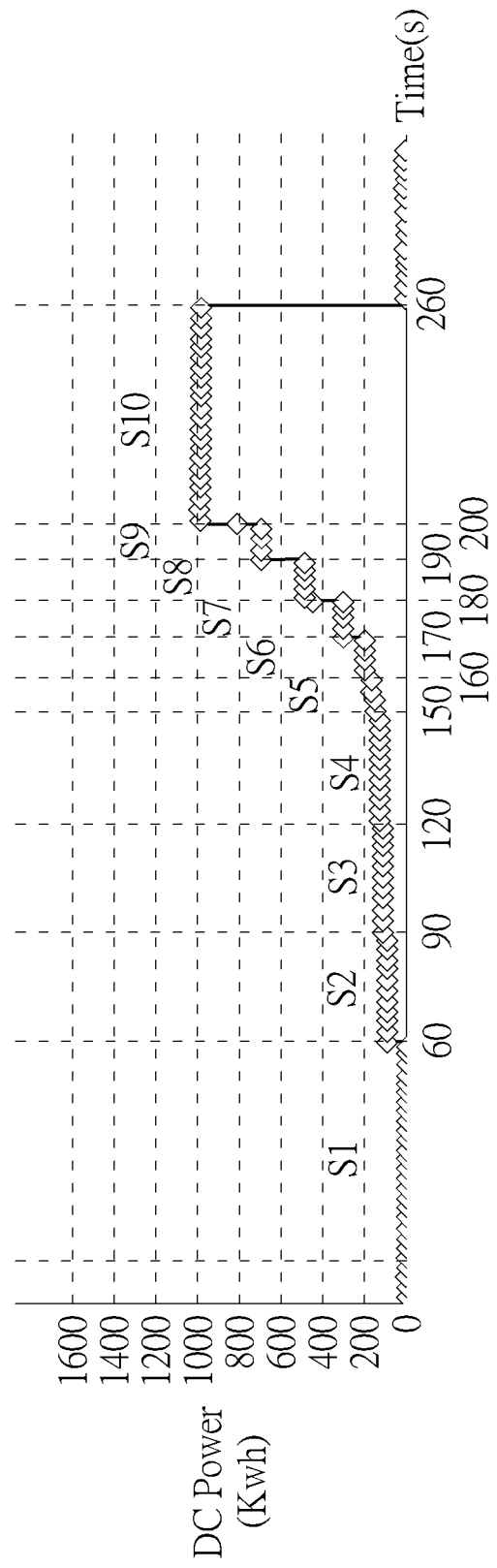
FIG. 5 is a plot of DC power versus time according to the paste process of FIG. 4
Figure 6:
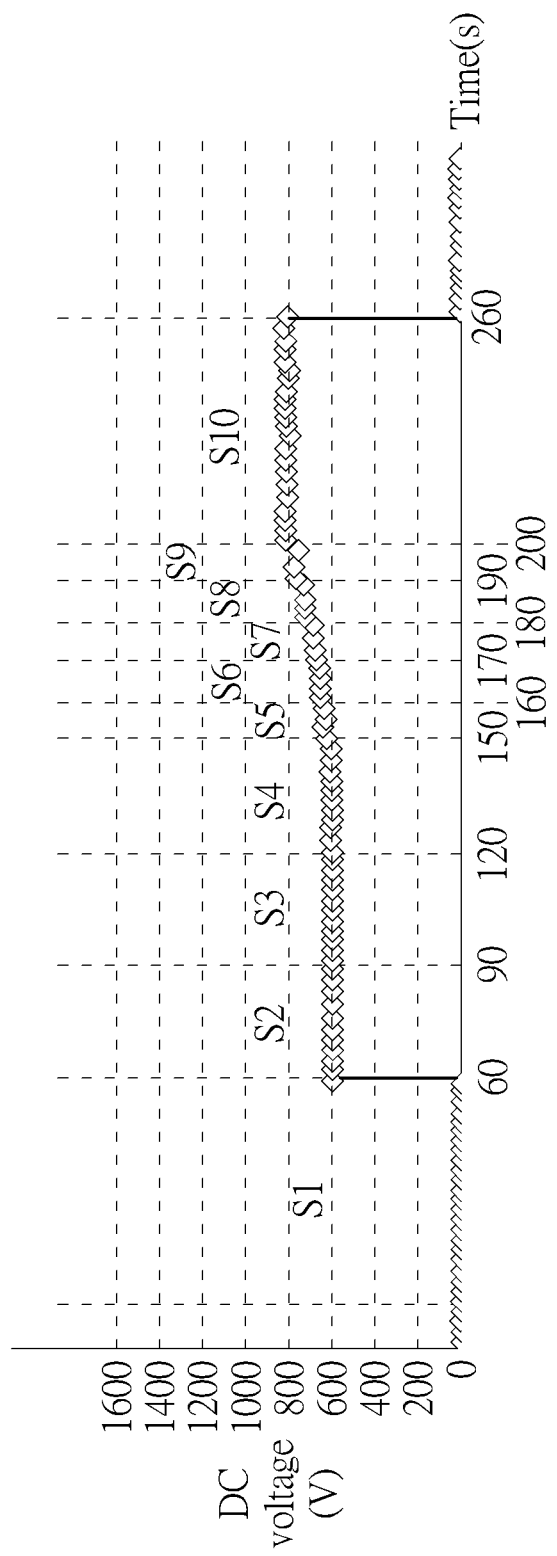
FIG. 6 is a plot of DC voltage versus time according to the paste process of FIG. 4.

Please refer to FIG. 4 to FIG. 6, wherein FIG. 4 is a table showing the parameters of the paste process according to another embodiment of the present invention, FIG. 5 is a plot of DC power versus time according to the paste process of FIG. 4, and FIG. 6 is a plot of DC voltage versus time according to the paste process of FIG. 4.

As shown in FIG. 4 and FIG. 1, according to another embodiment of the present invention, the paste process includes: admitting a working gas 136 into the PVD chamber 10, and then igniting the working gas 136 in cascade stages. In FIG. 4, a working gas 136 is first introduced into the PVD chamber 10 (S1), and then the working gas 136 is ignited in cascade stages in the PVD chamber 10, for example, comprising 9 stages from S2 to S10. In S2 stage, the DC power of 100 W is supplied for about 30 seconds. In S3 stage, the DC power of 110 W is supplied for about 30 seconds. In S4 stage, the DC power of 120 W is supplied for about 30 seconds. In S5 stage, the DC power of 150 W is supplied for about 10 seconds. In S6 stage, the DC power of 200 W is supplied for about 10 seconds. In S7 stage, the DC power of 300 W is supplied for about 10 seconds. In S8 stage, the DC power of 500 W is supplied for about 10 seconds. In S9 stage, the DC power of 700 W is supplied for about 10 seconds. In S10 stage, the DC power of 1000 W is supplied for about 60 seconds.

As can be seen in conjunction with FIG. 5 and FIG. 6, in the early stages of the paste process, the DC power including S2-S4 is relatively lower, the power increase is smaller, and the duration of each stage is longer (30 seconds). In the middle stages of the paste process, including S5-S9, the power is gradually increased, and the duration of each stage is shortened (10 seconds). In the final stage of the paste process, that is, S10, the DC power is increased to 1000 kWh and the duration is increased to 60 seconds. As can be seen from FIG. 6, during the implementation of the paste process, the DC voltage does not exceed 1000V.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for depositing a metal layer on a wafer, comprising:

providing a physical vapor deposition (PVD) chamber having therein a wafer chuck for holding a wafer to be processed, a target situated above said wafer chuck, a magnet positioned on a backside of said target, and a DC power supply for supplying a DC voltage to said target, wherein said target is a metal or a metal alloy having ferromagnetism property;

performing a paste process to said PVD chamber, the said paste process comprising sequential steps of: admitting a working gas into said PVD chamber; and igniting said working gas in cascade stages comprising applying a first DC power for a first time period, applying a second DC power greater than the first DC power for a second time period, applying a third DC power greater than the second DC power for a third time period, and applying a fourth DC power greater than the third DC power for a fourth time period, wherein a power difference between the first DC power and the second DC power is smaller than a power difference between the third DC power and the fourth DC power, and wherein said first DC power and said second DC power are less than 500 W, wherein said first time period is longer than the fourth time period;

loading said wafer into said PVD chamber and positioning said wafer onto said wafer chuck; and performing a deposition process to deposit a metal layer sputtered from said target onto said wafer.

2. The method according to claim 1, wherein said target comprises nickel (Ni), cobalt (Co), or alloys thereof.

3. The method according to claim 1, wherein said target comprises nickel platinum (NiPt) alloy.

4. The method according to claim 1, wherein said target comprises nickel platinum (NiPt) alloy with Pt in an amount of 0-10 wt. %.

5. The method according to claim 1, wherein said working gas comprises argon.

6. The method according to claim 1, wherein said admitting a working gas into said PVD chamber is at a flowrate of about 15-60 sccm for less than 60 seconds.

7. The method according to claim 1, wherein said first DC power is about 100 W and said first time period is less than or equal to 60 seconds.

8. The method according to claim 7, wherein said second DC power is 200 W and said second time period is less than or equal to 10 seconds.

9. The method according to claim 1, wherein said third DC power is 300 W and said third time period is less than or equal to 10 seconds.

10. The method according to claim 1, wherein said fourth DC power is 500 W and said fourth time period is less than or equal to 10 seconds.

11. The method according to claim 1, wherein said igniting said working gas in cascade stages further comprises: applying a fifth DC power for a fifth time period, wherein said fifth DC power is greater than said fourth DC power.

12. The method according to claim 11, wherein said fifth DC power is 700 W and said fifth time period is less than or equal to 10 seconds.

13. The method according to claim 11, wherein said igniting said working gas in cascade stages further comprises: applying a sixth DC power for a sixth time period, wherein said sixth DC power is greater than said fifth DC power.

14. The method according to claim 13, wherein said sixth DC power is 1000 W and said sixth time period is less than or equal to 60 seconds.

15. The method according to claim 1, wherein when performing said paste process to said PVD chamber, said DC voltage is greater than 0V and does not exceed 1000V.

16. The method according to claim 1, wherein said target reaches its Curie temperature when performing said paste process to said PVD chamber.

17. The method according to claim 1, wherein said deposition process comprises the steps of:
admitting said working gas into said PVD chamber;
maintaining chamber pressure at less than 5 mTorr; and
igniting said working gas by applying a DC power of about 2000 W for a maximum time period of about three seconds.

18. The method according to claim 1, wherein said first DC power is about 100 W, said first time period is about 30 seconds, said second DC power is about 110 W, and said second time period is about 30 seconds.

* * * * *